(12) United States Patent
Hu et al.

(10) Patent No.: US 6,825,495 B1
(45) Date of Patent: Nov. 30, 2004

(54) CMOS TRANSISTOR AND CMOS-BASED DEVICE

(75) Inventors: Jen-Yi Hu, Taipei Hsien (TW); Wein-Town Sun, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/605,010

(22) Filed: Sep. 1, 2003

(30) Foreign Application Priority Data

May 12, 2003 (TW) ........................................ 92112792 A

(51) Int. Cl.[7] ........................ H01L 26/76; H01L 31/036
(52) U.S. Cl. ........................................ 257/69; 257/67
(58) Field of Search .................................... 257/69, 67

(56) References Cited

U.S. PATENT DOCUMENTS 6,001,714 A * 12/1999 Nakajima et al. ........... 438/525

6,590,228 B2 * 7/2003 Voutsas et al. ............... 257/70

* cited by examiner

Primary Examiner—David Nelms
Assistant Examiner—Tu-Tu Ho
(74) Attorney, Agent, or Firm—Jiang Chyun IP Office

(57) ABSTRACT

A CMOS transistor is described. The CMOS transistor comprises a first TFT of a first conductivity type and a second TFT of a second conductivity type. The first TFT includes a gate, a channel region, a first doped region of the first conductivity type and a source region, wherein the channel region, the first doped region and the source region are arranged along a first direction. The second TFT includes a gate, a channel region, a second doped region of the second conductivity type and a drain region, wherein the channel region, the second doped region and the drain region are arranged along the first direction. The first and the second doped regions are arranged along a second direction that is perpendicular to the first direction, and are electrically connected by a conductive line extending along the second direction.

13 Claims, 5 Drawing Sheets

CMOS TRANSISTOR AND CMOS-BASED DEVICE

CROSS REFERENCE TO RELATED APPLICATIONS

This application claims the priority benefit of Taiwan application serial no. 92112792, filed May 12, 2003.

BACKGROUND OF INVENTION

1. Field of the Invention

The present invention relates to a low-temperature polysilicon (LTPS) thin film transistor (TFT). More particularly, the present invention relates to a complementary metal oxide semiconductor (CMOS) transistor consisting of two LTPS TFTs of different conductivity types, and a semiconductor device based on the CMOS transistor.

2. Description of the Related Art

With advances of high technologies, video products, especially digital video/image apparatuses, have been widely used in daily life. In a digital video/image apparatus, the display device is surely an important component for displaying information. A user can read the information from the display device, and may further operate the apparatus according to the information.

The hottest display product in recent years is no other than the liquid crystal display (LCD), especially the TFT-LCD utilizing active-matrix driving mechanism. In the field of TFT, the polysilicon-based TFT has been studied in much effort for possessing an electron mobility much larger than that of a conventional □-Si TFT. Therefore, polysilicon TFTs can be made smaller to increase the aperture ratio of the pixel and thereby enhance the brightness of the LCD. In other words, using polysilicon TFTs in a LCD consumes less energy when the same brightness is achieved. Moreover, because polysilicon has high electron mobility, the driving devices of a LCD can also be formed on the glass substrate within the polysilicon TFT process. Therefore, the performance and the reliability of a LCD panel can be improved, and the cost for fabricating a LCD panel or a LCD monitor is lowered. In addition, a polysilicon-TFT LCD is thin, light, and has a higher resolution, and is therefore particularly applicable to a mobile terminal product that requires weight reduction and electricity saving.

In the beginning, a poly-Si TFT is fabricated with a solid-phase crystallization (SPC) process, wherein the temperature is up to 1000° C. and a quartz substrate having a high melting point is required. However, since quartz is much more expensive than glass and the size of a quartz substrate is restricted to 2–3 inches, only a small-sized poly-Si TFT-LCD can be made with this method. To solve this problem, the so-called low-temperature polysilicon (LTPS) TFT process is provided, using laser crystallization or excimer laser annealing (ELA) to convert an □-Si film into a poly-Si film. Since the temperature of an LTPS-TFT process is lower than 600° C., a glass substrate generally used in an □-Si TFT-LCD can be used to fabricate a larger LCD panel.

In addition, since polysilicon has higher electron mobility, the driving devices of a LCD can be formed synchronously on the glass substrate around the display area during the LTPS-TFT process. FIGS. 1A-1B illustrate a CMOS transistor as an example of such LCD driving devices, wherein FIG. 1A illustrates a top view of a conventional CMOS transistor including an N-type LTPS TFT and a P-type LTPS TFT, and FIG. 1B illustrates a cross-sectional view of the CMOS transistor in FIG. 1A along line I–I'.

Referring to FIGS. 1A-1B, a conventional CMOS transistor 10 includes an N-type LTPS TFT 110 and a P-type LTPS TFT 120 disposed on a substrate 100. The N-type LTPS TFT 110 includes a gate 102 and a polysilicon island 104 between the gate 102 and the substrate 100, wherein the polysilicon island 104 includes a channel region 105 and a doped region 106a and a drain region 106b beside the channel region 105. The P-type LTPS TFT 120 includes a gate 112 and a polysilicon island 114 between the gate 112 and the substrate 100, wherein the polysilicon island 114 includes a channel region 115 and a source region 116a and a doped region 116b beside the channel region 115. The N-type LTPS TFT 110 and the P-type LTPS TFT 120 are covered by an inter-layer dielectric layer 130, and the doped region 106a of the N-type LTPS TFT 110 and the doped region 116b of the P-type LTPS TFT 120 are electrically connected via two contacts 132 through the inter-layer dielectric layer 130 and a conductive line 122.

The polysilicon island 104/114 is isolated from the gate 102/112 by a gate insulating film 124, and is separated from the substrate 100 by a buffer layer 126. In the N-type LTPS TFT 110, a lightly doped drain (LDD) region 107 is located between the channel region 105 and the doped region 106a/drain region 106b. In addition, source/drain contact metals 128 are disposed connecting with the source region 116a and the drain region 106b.

As shown by the CMOS transistor layout in FIG. 1A, since the N-type LTPS TFT 110 and the P-type LTPS TFT 120 are arranged in series in the lateral direction, the doped region 106a of the N-type LTPS TFT 110 and the doped region 116b of the P-type LTPS TFT 120 are separated by a minimal distance in the lateral direction. Consequently, when the contact 132 in FIG. 1A has a width/length of 6□m/6□m, for example, the overall width 142 of the CMOS transistor 10 is up to about 56□m because of the design rule. Since the minimal width of a conventional CMOS transistor is large, the conventional CMOS layout is not suitable for a planar display having a reduced pixel size and a higher resolution.

SUMMARY OF INVENTION

In view of the foregoing, this invention provides a CMOS transistor and a semiconductor device based on the CMOS transistor to decrease the layout width, so that the peripheral area of a glass substrate is sufficient for forming CMOS-based driving devices when the resolution of the display area is increased.

The CMOS transistor of this invention includes a first TFT of a first conductivity type, a second TFT of a second conductivity type, an inter-layer dielectric layer, a conductive line, a source contact metal and a drain contact metal. The first TFT includes a first gate and a first polysilicon island under the first gate, wherein the first polysilicon island includes a first channel region right under the first gate, a source region on one side of the first gate, and a first doped region of a first conductivity type on the other side of the first gate. The source region, the first channel region and the first doped region are arranged along a first direction. The second TFT includes a second gate and a second polysilicon island under the second gate, wherein the second polysilicon island includes a second channel region right under the second gate, a second doped region of a second conductivity type on one side of the second gate, and a drain region on the other side of the second gate. The second doped region, the second channel region and the drain region are arranged along the first direction, and the second doped region and the first doped region are arranged along a second direction that is perpendicular to the first direction. The inter-layer dielectric layer covers the first TFT and the second TFT, and has a plurality of contacts therein connecting with the first doped region and the second doped region. The conductive line is disposed on the inter-layer dielectric layer extending along the second direction, and electrically connects the first doped region and the second doped region via the contacts. The source contact metal is disposed on and through the inter-layer dielectric layer to electrically connect with the source region, and the drain contact metal on and through the inter-layer dielectric layer to electrically connect with the drain region.

The CMOS-based device of this invention includes at least one first LTPS TFT of a first conductivity type, second LTPS TFTs of a second conductivity type, an inter-layer dielectric layer, conductive lines and source/drain contact metals. The first LTPS TFT is arranged parallel to the second LTPS TFTs with a displacement relative to each of the second LTPS TFTS, and includes a first gate line and a first polysilicon island under the first gate line. The first polysilicon island includes a first channel region right under the first gate line, a first doped region on one side of the first gate line, and a second doped region on the other side of the first gate line. Each of the second LTPS TFTs includes a second gate line and a second polysilicon island under the second gate line, wherein the second polysilicon island includes a second channel region right under the second gate line, a third doped region on one side of the second gate line, and a source/drain region on the other side of the second gate line. The inter-layer dielectric layer covers the first TFT and the second TFTs, and has contacts therein connecting with the first doped region, the second doped region and the third doped region, respectively. Each conductive line is disposed on the inter-layer dielectric layer extending substantially parallel to the first gate line and the second gate line, and electrically connects the first (or second) doped region and a third doped region via the contacts. A source/drain contact metal is disposed on and through the inter-layer dielectric layer to electrically connect with a source/drain region.

Since the first LTPS TFT and the second LTPS TFT in a CMOS transistor of this invention are arranged in parallel with a relative displacement in the first direction, the overall width of the CMOS transistor or the CMOS-based device can be remarkably reduced to apply to a high-resolution display.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

First Embodiment

Figure 2A:
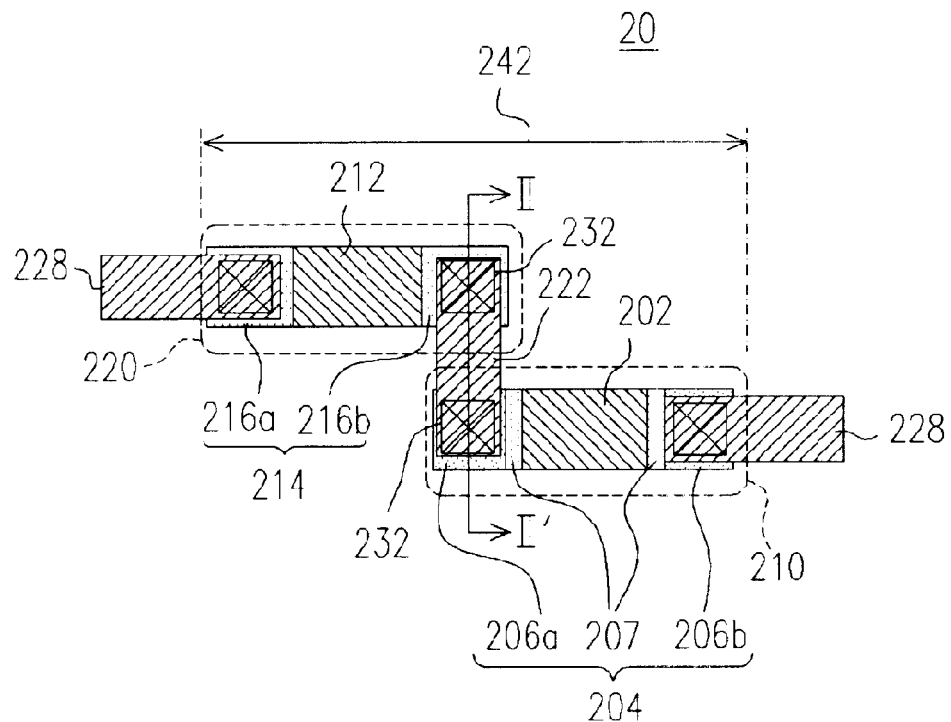
FIG. 2A illustrates a top view of a CMOS transistor according to a first embodiment of this invention.
Figure 2B:
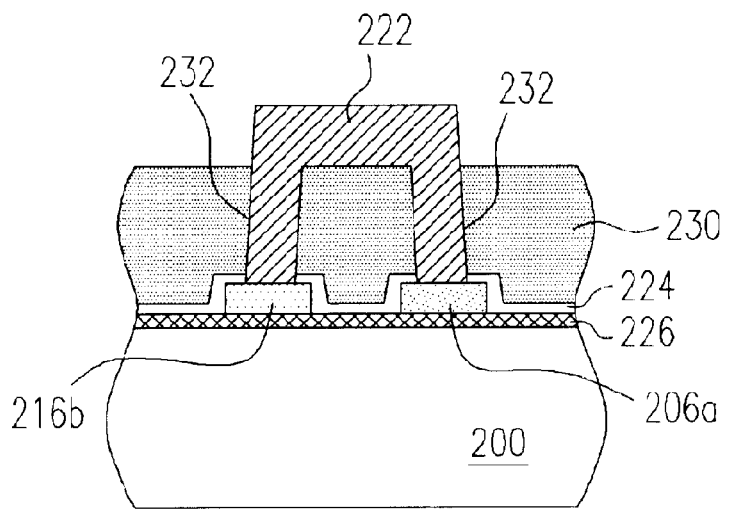
FIG. 2B illustrates a cross-sectional view of the CMOS transistor in FIG. 2A along line II–II'.

The CMOS transistor constituted of two LTPS TFTs according to the first embodiment of this invention will be described with reference to FIGS. 2A-2B, wherein FIG. 2A illustrates a top view of the CMOS transistor, and FIG. 2B illustrates a cross-sectional view of the CMOS transistor in FIG. 2A along line II–II'.

Referring to FIGS. 2A-2B, the CMOS transistor 20 includes an N-type LTPS TFT 210 and a P-type LTPS TFT 220 that are covered by an inter-layer dielectric layer 230. The N-type LTPS TFT 210 includes a gate 202 and a polysilicon island 204 between the gate 202 and the substrate 200, wherein the polysilicon island 204 includes a channel region right under the gate 202 and an N-doped region 206a and a drain region 206b beside the channel region. It is to be noted that the channel region is completely covered by the gate 202 in the top view and therefore cannot be labeled with a reference number. The drain region 206b is connected with a drain contact metal 228 disposed on and through the inter-layer dielectric layer 230. The channel region, the drain region 206b and the N-doped region 206a are arranged in a first direction.

The P-type TFT 220 includes a gate 212 and a polysilicon island 214 between the gate 212 and the substrate 200, wherein the polysilicon island 214 includes a channel region (not labeled with a reference number for the same reason) right under the gate 212 and a source region 216a and a P-doped region 216b beside the channel region. The source region 216a is connected with a source contact metal 228 disposed on and through the inter-layer dielectric layer 230. The P-doped region 216b, the channel region and the source region 216a are arranged along the first direction, while the P-doped region 216b and the N-doped region 206a are arranged along a second direction that is perpendicular to the first direction.

Figure 1A:
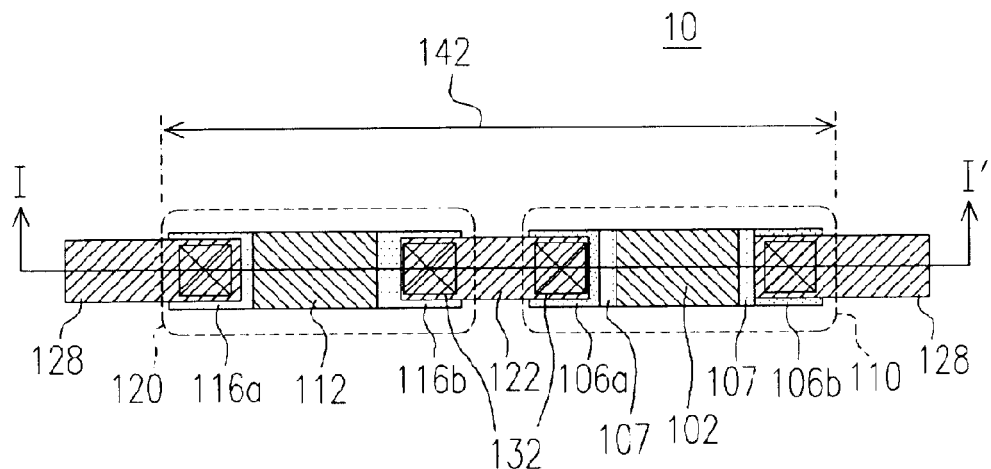
FIG. 1A illustrates a top view of a conventional CMOS transistor including an N-type LTPS TFT and a P-type LTPS TFT.
Figure 1B:
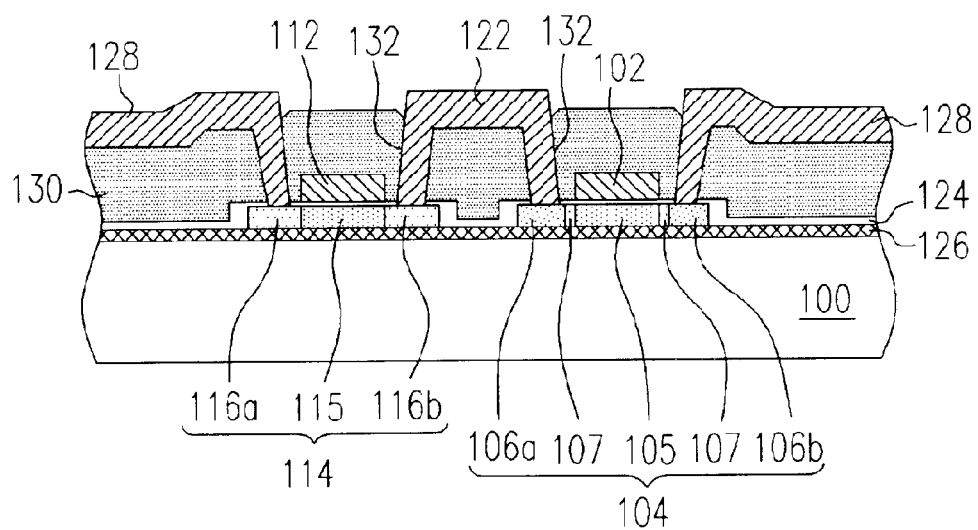
FIG. 1B illustrates a cross-sectional view of the CMOS transistor in FIG. 1A along line I–I'.

The N-doped region 206a of the N-type LTPS TFT 210 and the P-doped region 216b of the P-type LTPS TFT 220 are electrically connected via two contacts 232 through the inter-layer dielectric layer 230 and a conductive line 222 extending along the second direction. Since the N-type LTPS TFT 210 and the P-type LTPS TFT 220 are arranged in parallel with a relative displacement in the first direction, the overall width of the CMOS transistor 20 can be remarkably reduced as compared with the prior art. For example, when the contact 232 has a width/length of 6□m/6□m, the overall width of the CMOS transistor 20 is reduced to about 45□m, which is smaller than the width 142 of the conventional CMOS transistor in FIG. 1A by about 20%.

Referring to FIGS. 2A and 2B again, the polysilicon island 204/214 is isolated from the gate 202/212 by a gate insulating film 224, and is separated from the substrate 200 by a buffer layer 226. Moreover, in the N-type LTPS TFT 210, a lightly doped drain 207 is formed between the channel region right under the gate 202 and the drain region 206b as well as between the channel region and the N-doped region 206a.

It is noted that the above embodiment is provided to further explain the present invention, but is not intended to restrict the scope of the present invention. Specifically speaking, though the P-type TFT and the N-type TFT in the embodiment have the aforementioned structures, they can have any other structures as long as they are arranged in parallel with a relative displacement in the first direction.

Second Embodiment

The second embodiment of this invention describes a CMOS-based device consisting of two P-type TFTs and one N-type TFT, which is a semiconductor device based on the CMOS transistor of this invention. However, the CMOS-based device of this invention is not restricted to the one mentioned in the second embodiment, and the layout of a CMOS-based device composed of any number of P-type TFT and N-type TFT can be designed according to the rule of this invention.

Figure 3:
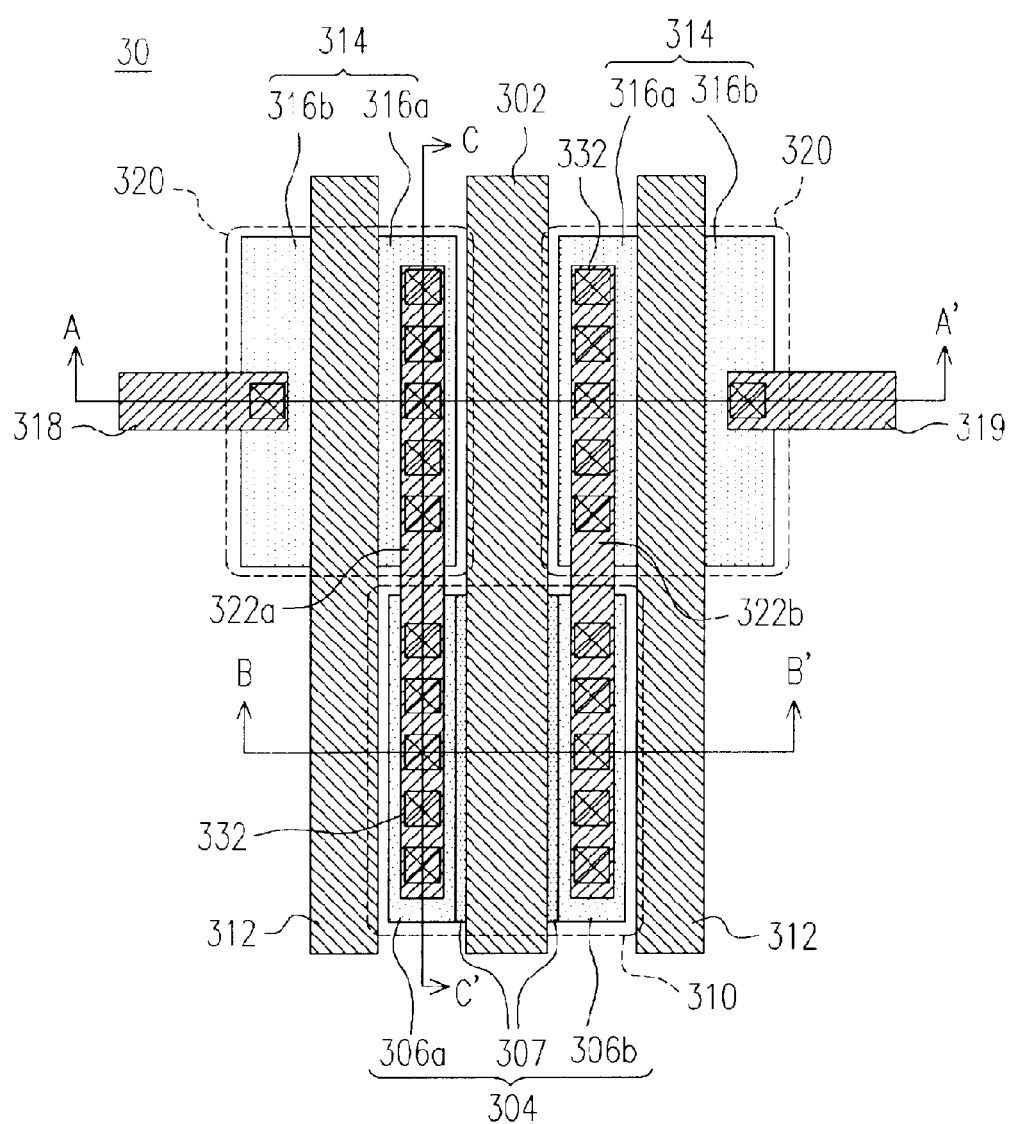
FIG. 3 illustrates a top view of a CMOS-based device according to a second embodiment of this invention.
Figure 4A:
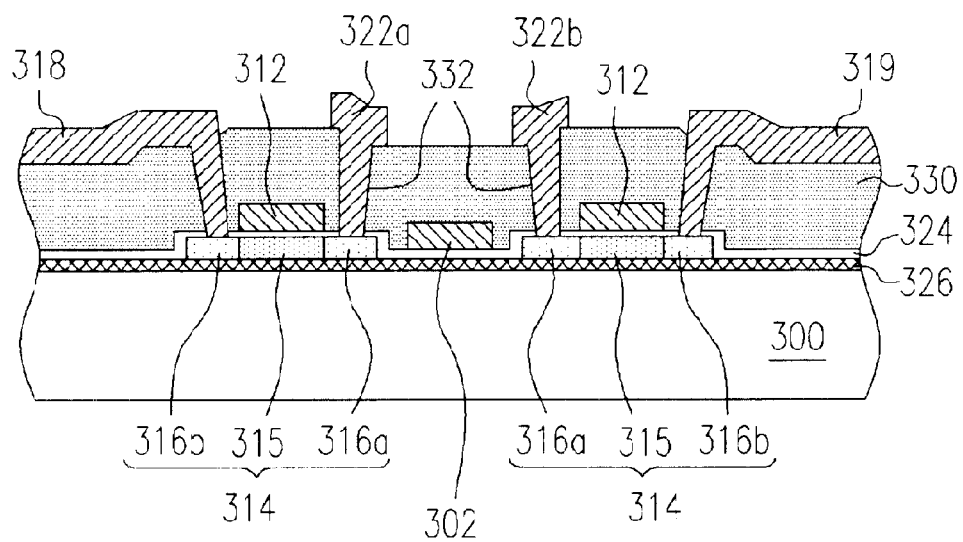
FIG. 4A illustrates a cross-sectional view of the CMOS-based device in FIG. 3 along line A–A'.
Figure 4B:
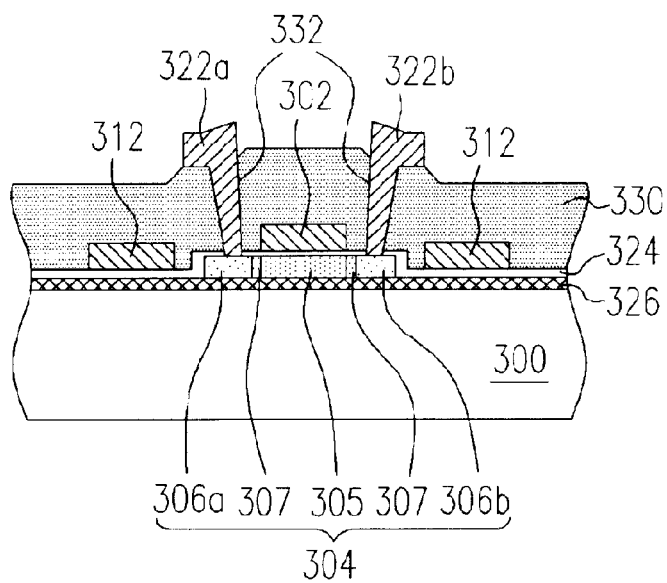
FIG. 4B illustrates a cross-sectional view of the CMOS-based device in FIG. 3 along line B–B'.
Figure 4C:
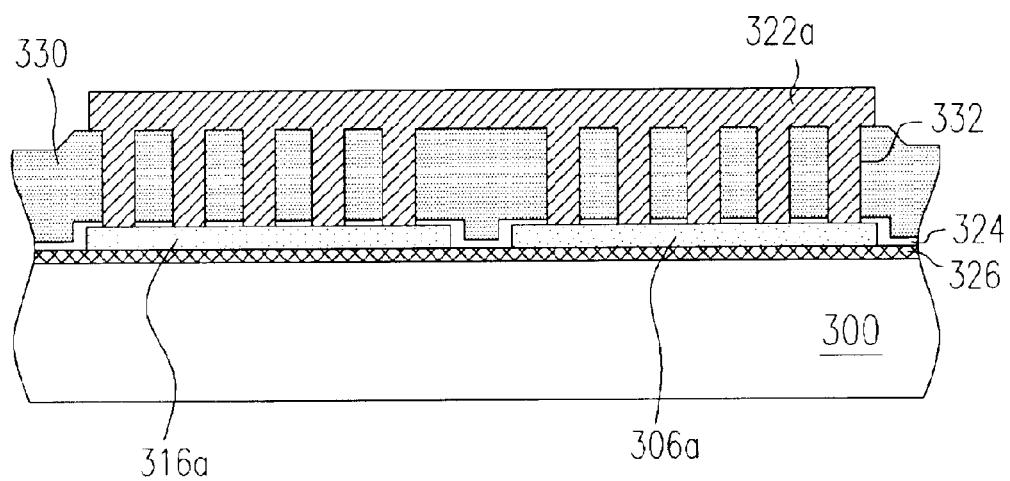
FIG. 4C illustrates a cross-sectional view of the CMOS-based device in FIG. 3 along line C–C'.

FIG. 3 illustrates a top view of a CMOS-based device according to the second embodiment of this invention, and FIGS. 4A, 4B and 4C illustrate cross-sectional views of the CMOS-based device in FIG. 3 along lines A–A", B–B" and C–C", respectively. The CMOS-based device 30 includes two P-type LTPS TFTs 320 and an N-type LTPS TFT 310 that is arranged in parallel to the two P-type LTPS TFTs 320 with a displacement relative to each of the two P-type LTPS TFTs 320 in the lateral direction of the figure.

The N-type LTPS TFT 310 includes a gate line 302 and a polysilicon island 304 under the gate line 302. The polysilicon island 304 includes a channel region (not labeled with a reference number for the same reason) right under the gate line 302 and two doped regions 306a and 306b beside the channel region. Each of the P-type LTPS TFTs 320 includes a gate line 312 and a polysilicon island 314 under the gate line 312. The polysilicon island 314 includes a channel region (not labeled with a reference number for the same reason) right under the gate line 312 and a doped region 316a and a source/drain region 316b beside the channel region. As shown in FIG. 4A, a source/drain region 316b is connected with a source/drain contact metal 318 (or 319). Each of the doped regions 306a and 306b of the N-type LTPS TFT 310 is electrically connected with a doped region 316a of a P-type LTPS TFT 320 via a contact 332 and a conductive line 322a (or 322b), wherein the conductive lines 322a and 322b are parallel to the gate lines 302 and 312.

The second embodiment of this invention is further explained as follows with reference to FIGS. 4A, 4B and 4C, which illustrate cross-sectional views of the COMS-based device in FIG. 3 along lines A–A', B–B' and C–C', respectively.

Referring to FIG. 4A, the substrate 300, the gate lines 312 and the polysilicon islands 314 are covered by the inter-layer dielectric layer 330, and a doped region 316a is connected with a contact 332 through the inter-layer dielectric layer 330. A channel region 315 is right under a gate line 312. A polysilicon island 314 is isolated from a gate line 312 by a gate insulating layer 324, and is separated from the substrate 300 by a buffer layer 326.

Referring to FIG. 4B, the contacts 332 through the inter-layer dielectric layer 330 are connected with the doped regions 306a and 306b, and the channel region 305 is right under the gate line 302. In addition, a lightly doped drain (LDD) region 307 is formed between the channel region 305 and the doped region 306a as well as between the channel region 305 and the doped region 306b.

Referring to FIG. 4C, the conductive line 322a is parallel to the cross-sectional plane, connecting the doped regions 306a and 316a of two LTPS TFTs of different conductivity types.

Since the first LTPS TFT and the second LTPS TFT in the CMOS transistor of this invention are arranged in parallel with a relative displacement in the first direction (the lateral direction of the figures), the overall width of the CMOS transistor or the CMOS-based device can be remarkably reduced to apply to a high-resolution display.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A complementary metal oxide semiconductor (CMOS) transistor, comprising:

a first thin-film transistor (TFT) of a first conductivity type, comprising:

a first gate; and a first polysilicon island under the first gate, comprising:

a first channel region right under the first gate;

a source region on one side of the first gate; and a first doped region of a first conductivity type on the other side of the first gate, wherein the source region, the first channel region and the first doped region are arranged along a first direction;

a second TFT of a second conductivity type, comprising:

a second gate; and a second polysilicon island under the second gate, comprising:

a second channel region right under the second gate;

a second doped region of a second conductivity type on one side of the second gate; and a drain region on the other side of the second gate, wherein the second doped region, the second channel region and the drain region are arranged along the first direction, and the second doped region and the first doped region of the first TFT are arranged along a second direction that is perpendicular to the first direction;

an inter-layer dielectric layer covering the first TFT and the second TFT, having a plurality of contacts therein connecting with the first doped region and the second doped region, respectively;

a conductive line on the inter-layer dielectric layer extending along the second direction, the conductive line electrically connecting the first doped region and the second doped region via the contacts;

a source contact metal disposed on and through the inter-layer dielectric layer to electrically connect with the source region; and a drain contact metal disposed on and through the inter-layer dielectric layer to electrically connect with the drain region.

2. The CMOS transistor of claim 1, wherein the first TFT comprises a low-temperature polysilicon (LTPS) TFT.

3. The CMOS transistor of claim 1, wherein the second TFT comprises a LTPS TFT.

4. The CMOS transistor of claim 1, wherein the first TFT comprises an N-type TFT.

5. The CMOS transistor of claim 4, wherein the first polysilicon island further comprises a lightly doped drain (LDD) region between the first channel region and the source region as well as between the first channel region and the first doped region.

6. The CMOS transistor of claim 4, wherein the second TFT comprises a P-type TFT.

7. The CMOS transistor of claim 1, wherein the first TFT comprises a P-type TFT.

8. The CMOS transistor of claim 7, wherein the second TFT comprises an N-type TFT.

9. The CMOS transistor of claim 8, wherein the second polysilicon island further comprises a lightly doped drain (LDD) region between the second channel region and the drain region as well as between the second channel region and the second doped region.

10. A CMOS-based device, comprising: at least one first LTPS TFT of a first conductivity type, comprising:
 a first gate line; and
 a first polysilicon island under the first gate line, comprising:
 a first channel region right under the first gate line;
 a first doped region on one side of the first gate line; and
 a second doped region on the other side of the first gate line;
a plurality of second LTPS TFTs of a second conductivity type arranged parallel to the first LTPS TFT, wherein each second LTPS TFT comprises:
 a second gate line; and
 a second polysilicon island under the second gate line, comprising:
 a second channel region right under the second gate line;
 a third doped region on one side of the second gate line; and
 a source/drain region on the other side of the second gate line;
an inter-layer dielectric layer covering the first TFT and the second TFT, having a plurality of contacts therein connecting with the first doped region, the second doped region and the third doped region, respectively;
a plurality of conductive lines on the inter-layer dielectric layer extending substantially parallel to the first gate line and the second gate line, wherein one conductive line electrically connects the first doped region and the third doped region via a set of the contacts, and another conductive line electrically connects the second doped region and the third doped region via another set of the contacts; and
a plurality of source/drain contact metals disposed on and through the inter-layer dielectric layer, wherein each source/drain region is connected with at least one source/drain contact metal.

11. The CMOS-based device of claim 10, wherein the second TFTs comprise P-type TFTs.

12. The CMOS-based device of claim 11, wherein the first TFT comprises an N-type TFT.

13. The CMOS-based device of claim 12, wherein the first polysilicon island further comprises a lightly doped drain region between the first channel region and the first doped region as well as between the first channel region and the second doped region.

* * * * *